United States Patent
Lyons et al.

(10) Patent No.: US 6,852,455 B1
(45) Date of Patent: Feb. 8, 2005

(54) AMORPHOUS CARBON ABSORBER/SHIFTER FILM FOR ATTENUATED PHASE SHIFT MASK

(75) Inventors: Christopher F. Lyons, Fremont, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 130 days.

(21) Appl. No.: 10/237,643

(22) Filed: Sep. 9, 2002

Related U.S. Application Data

(60) Provisional application No. 60/399,780, filed on Jul. 31, 2002.

(51) Int. Cl.[7] ................................................. G03F 9/00
(52) U.S. Cl. ......................................................... 430/5
(58) Field of Search ....................... 430/5, 322; 378/35; 204/192.15, 192.3

(56) References Cited

U.S. PATENT DOCUMENTS

| | | | | |
|---|---|---|---|---|
| 5,830,332 | A | * 11/1998 | Babich et al. | ......... 204/192.15 |
| 6,548,417 | B2 | * 4/2003 | Dao et al. | .................... 438/710 |
| 6,573,030 | B1 | * 6/2003 | Fairbairn et al. | ........... 430/323 |

\* cited by examiner

*Primary Examiner*—S. Rosasco
(74) *Attorney, Agent, or Firm*—Foley & Lardner LLP

(57) ABSTRACT

An exemplary embodiment relates to a phase shifting mask including a glass substrate layer and an amorphous carbon absorber layer located above the glass substrate layer. The amorphous carbon absorber layer includes apertures through which light passes unaltered to the glass substrate layer.

18 Claims, 4 Drawing Sheets

AMORPHOUS CARBON ABSORBER/SHIFTER FILM FOR ATTENUATED PHASE SHIFT MASK

REFERENCE TO RELATED APPLICATIONS

This application claims priority to U.S. Provisional Application No. 60/399,780 filed Jul. 31, 2002.

FIELD OF THE INVENTION

The present disclosure relates generally to lithography and methods of lithographic patterning. More particularly, the present disclosure relates to an amorphous carbon absorber/shifter film for attenuated phase shift mask.

BACKGROUND OF THE INVENTION

In general, a reticle or mask is a lithographic tool which contains a pattern that is transferred to a wafer. In the field of integrated circuits, a reticle can be classified as a plate that contains the pattern for one or more die but is not large enough to transfer a wafer sized pattern all at once. In the field of integrated circuits, a mask can be classified as a plate that contains a pattern large enough to pattern a whole wafer at a time. The pattern for reticles and masks can be formed of opaque and non-opaque areas disposed on a glass plate (e.g., fused silica, soda-lime glass, borosilicate glass, fluorinated silicon dioxide, and quartz). The opaque areas often include chromium, emulsion, ion oxide, and/or chromium oxide. Alternatively, the pattern can be manifested on a conventional phase shift mask. Conventional phase shift masks can include opaque areas and phase shift areas which define the pattern.

Semiconductor fabrication techniques often utilize a mask or reticle. Radiation is provided through or reflected off the mask or reticle to form an image on a semiconductor wafer. The wafer is positioned to receive the radiation transmitted through or reflected off the mask or reticle. The image on the semiconductor wafer corresponds to the pattern on the mask or reticle. The radiation can be light, such as ultraviolet light, vacuum ultraviolet light, etc. The radiation can also be x-ray radiation, e-beam radiation, etc.

Generally, the image is focused on the wafer to pattern a layer of material, such as, photoresist material. The photoresist material can be utilized to define doping regions, deposition regions, etching regions, or other structures associated with an integrated circuit (IC). The photoresist material can also define conductive lines or conductive pads associated with metal layers of an integrated circuit. Further, the photoresist material can define isolation regions, transistor gates, or other transistor structures and elements.

A conventional lithographic system is generally utilized to project the image to the wafer. For example, the conventional lithographic system includes a source of radiation, an optical system, and a reticle or photomask. The source of radiation provides radiation through the optical system and through or off of the mask or reticle.

The pattern image on the reticle is stepped and repeated to expose an entire substrate, such as, a wafer, while the pattern on a photomask or mask is transmitted to an entire wafer. However, as used in this application, the terms reticle, photomask, and mask are interchangeable unless specifically described otherwise. The photomask can be positive or negative (clear-field or dark-field tools).

According to a conventional mask patterning process, the glass substrate is polished in a multiple step process. The polished substrate is cleaned and inspected for defects. After inspecting the glass substrates, the glass substrates are coated with an opaque material, (e.g., an absorbing layer). The glass substrates can be coated in a sputter deposition process.

The opaque material is selectively etched according to a lithographic process. The opaque material is coated with a resist material. The resist material is patterned via an optical pattern generator. A conventional optical pattern generator utilizes shutters, light sources, optical components, and movable stages to produce the appropriate optical pattern on the resist material. The resist material is then removed in accordance with the optical pattern. The opaque material is removed in accordance with the remaining resist material. The opaque material can be removed by wet etching. Thus, the absorbing material is patterned or etched in accordance with the image desired to be formed on the substrate (e.g., the image provided by the optical pattern generators).

Manufacturing masks and reticles is time consuming and costly. Further, the equipment including the optical pattern generators required to manufacture the masks and reticles is expensive. Masks and reticles must be manufactured for each image to be transferred on the wafer.

In general, phase shift masks include phase shifting areas surrounding mask features. These phase shifting areas alter the phase of light passing through to improve resolution depth of focus for the mask features. Alternating phase shift masks use alternating apertures etched in quartz on the mask to affect the phase shift. Attenuating phase shift masks use a partially opaque phase shifting absorber (referred to as the attenuator) material, such as, MoSi. Only a percentage of light passes through the opaque material and the phase of the light can be changed by 180 degrees.

Two attenuator properties can be optimized with attenuated phase shift masks: thickness and transparency. Thickness of a phase shifting material can be adjusted to obtain the appropriate phase. Transparency of the phase shifting material can be adjusted to determine how much phase delayed light passes through Traditionally, refractory metal oxides and silicides have been used for phase shift and transparency in attenuated phase shift masks (PSM). For example, molybdenum silicon (MoSi) and chromium oxide ($CrO_2$) can be used. Optimal mask performance can be difficult to achieve with such materials. Some of the difficulties encountered with these materials are etchability and reflection control for mask patterning. Typically, the etch selectives of the photoresist is poor to these materials. The amorphous carbon is designed to transfer a photoresist pattern with high selectivity.

It would be desirable to use amorphous carbon as a partially transmissive phase shifting film for attenuated phase shift mask (PSM) fabrication. Further, it would be desirable to use amorphous carbon in attenuators of a PSM. Yet further, it would be desirable to use the properties of amorphous carbon in a PSM. Yet further still, there is a need for an amorphous carbon-based PSM. Yet further, there is a need for a method of making an amorphous carbon-based PSM.

SUMMARY OF THE INVENTION

An exemplary embodiment relates to a phase shifting mask including a glass substrate layer and an amorphous carbon absorber layer located above the glass substrate layer. The amorphous carbon absorber layer includes apertures through which light passes unaltered to the glass substrate layer.

Another exemplary embodiment relates to an attenuated phase shift mask having an amorphous carbon absorber film used in transferring patterns to an integrated circuit wafer. The mask includes a substrate, an amorphous carbon absorber layer above the substrate, a transfer layer above the amorphous carbon absorber layer, and an anti-reflective coating (ARC) layer above the transfer layer.

Another exemplary embodiment relates to an attenuated phase shift mask system. The phase shift mask system includes a phase shift mask having a substrate and a patterned amorphous carbon layer above the substrate, a light source positioned above the phase shift mask and configured to provide light to the phase shift mask, and an integrated circuit wafer located below the phase shift mask. The integrated circuit wafer is configured to receive a pattern from the phase shift mask. The light from the light source is attenuated when passing through the amorphous carbon layer.

Other principle features and advantages of the invention will become apparent to those skilled in the art upon review of the following drawings, the detailed description, and the appended claims.

BRIEF DESCRIPTION OF THE DRAWINGS

The exemplary embodiments of the disclosure will hereafter be described with reference to the accompanying drawings, wherein like numerals denote like elements, and.

DESCRIPTION OF THE EXEMPLARY EMBODIMENTS

Figure 1:
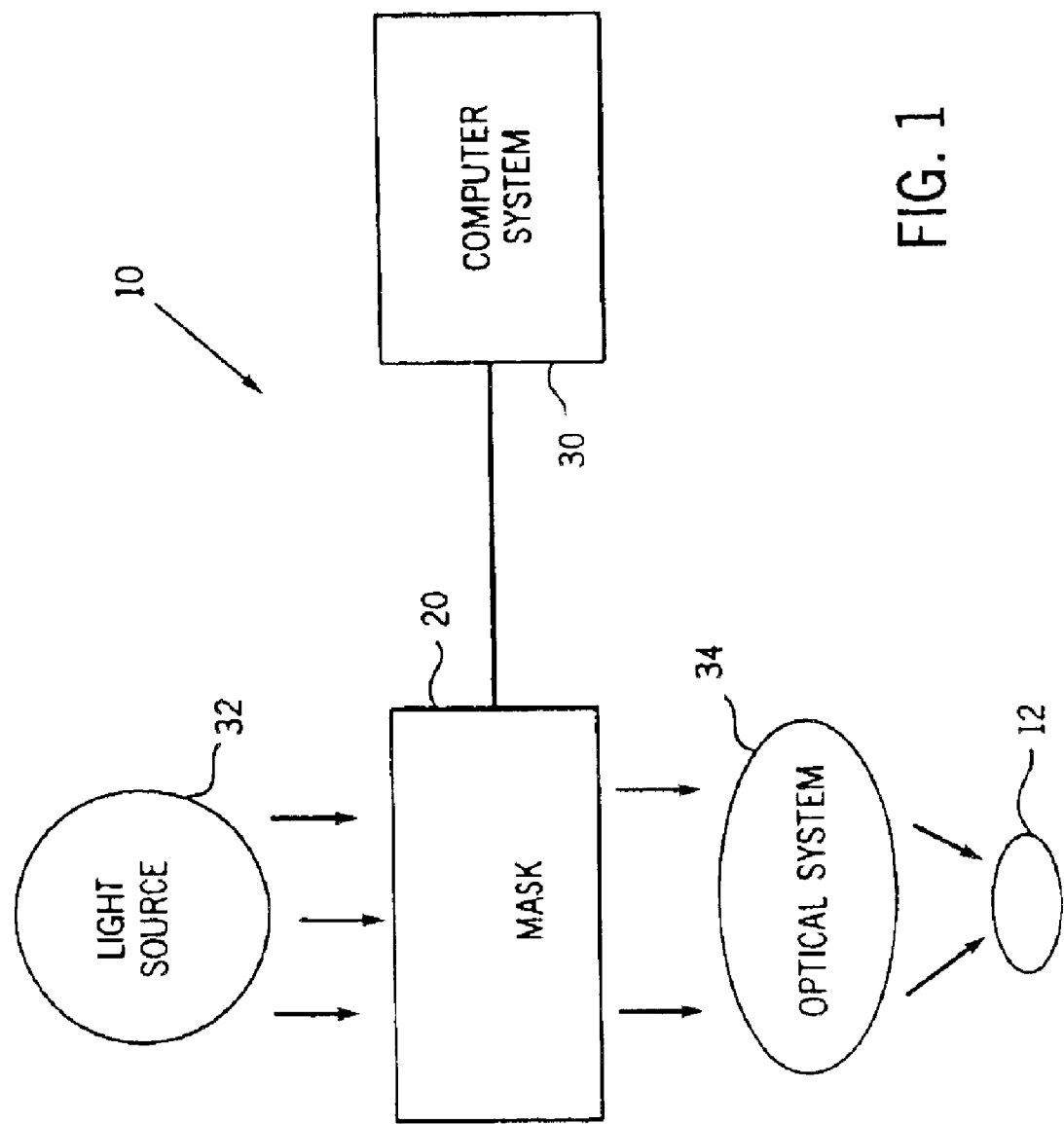
FIG. 1 is a general schematic block diagram of an integrated circuit (IC) fabrication system including a mask and a computer system in accordance with an exemplary embodiment.

With reference to FIG. 1, an integrated circuit fabrication system 10 is utilized to provide an image to a substrate, such as, a semiconductor or integrated circuit (IC) wafer 12. The image is generally provided as light to wafer 12. The light preferably has a wavelength in the range of 100 nm to 700 nm. The type of semiconductor process, the type of light, the layer being configured on wafer 12, the type of wafer 12 and the type of equipment are not described below in a limiting fashion.

Wafer 12 can be the substrate for a variety of types of integrated circuits including memory units, logic circuits, communications devices, processors, application specific integrated circuits (ASICs), or other devices. Preferably, wafer 12 is a semiconductor (e.g., silicon) wafer upon which insulative, conductive, and semiconductive materials are deposited in an IC fabrication process.

System 10 can be implemented in a variety of semiconductor tools which utilize lithography. For example, system 10 can be part of a an ultraviolet light stepper unit. System 10 includes a reticle or mask 20 and a computer system 30. System 10 can also include a light source 32 and an optical system 34.

Mask 20 can be embodied as a glass plate with a pattern of transparent and opaque areas used to photolithographically create patterns on wafers. Light is provided through mask 20 from light source 32 through optical system 34 to wafer 12. Optical system 34 can include mirrors, lenses, and other apparatus necessary to direct image 34 to wafer 12. Mask 20 can also be a reticle for use in step and repeat processes.

Optical system 34 can include lenses that reduce the image provided to wafer 12. Optical system 34 can have a reduction ratio between 1:1 to 10:1. Preferably, optical system 34 has a reduction ratio of 4:1. Light source 32 can be a 1 Amp, such as, a mercury or mercury-vapor lamp. Source 32 can include mirrors, lenses, and other reflective surfaces.

Figure 2:
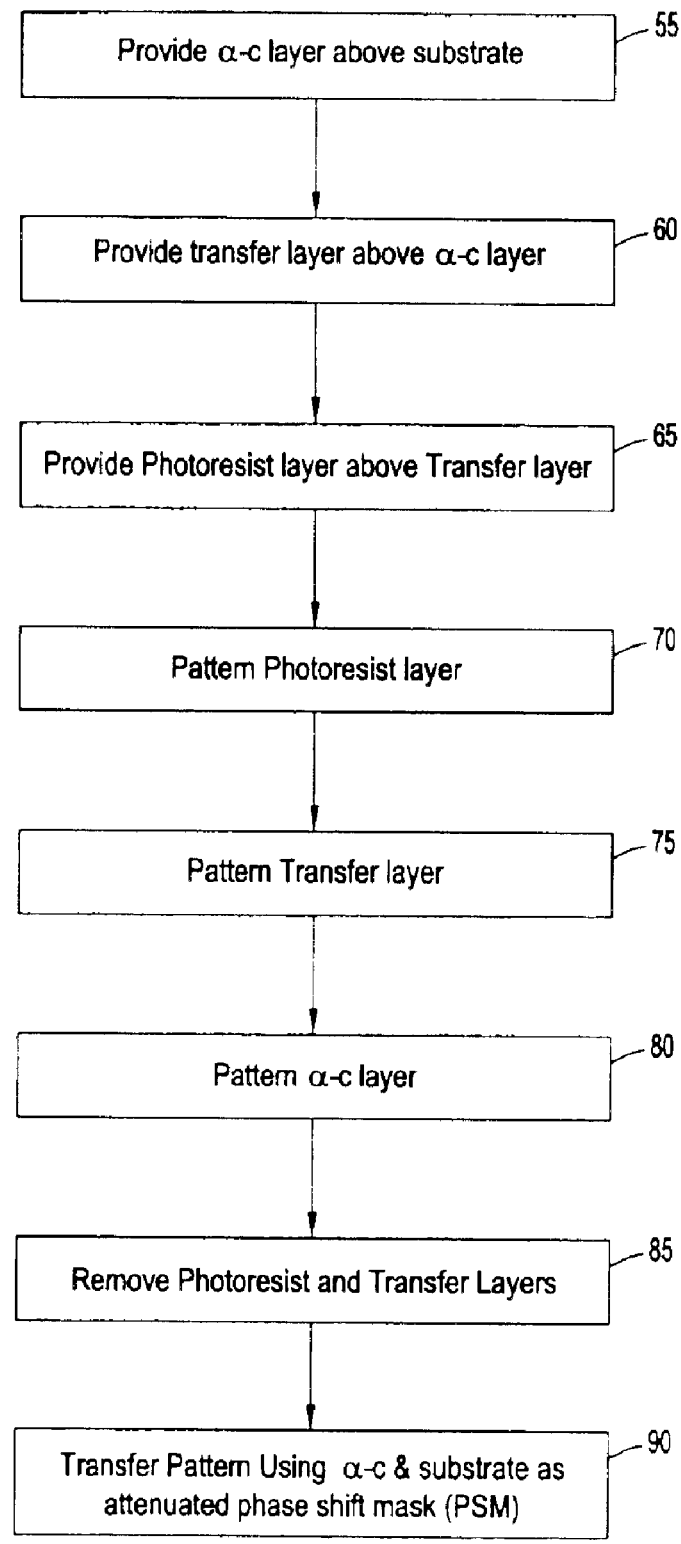
FIG. 2 is a flow diagram for a process of fabricating a mask and utilizing it in a lithographic fabrication process in accordance with an exemplary embodiment.

FIG. 2 illustrates a flow diagram 50 of an exemplary process of fabricating a mask and utilizing it in a lithographic fabrication process. Flow diagram 50 illustrates by way of example some steps that may be performed. Additional steps, fewer steps, or combinations of steps may be utilized in various different embodiments.

In an exemplary embodiment, a step 55 is performed in which an amorphous carbon layer is applied above a substrate of a mask. The substrate can be a glass substrate. In a step 60, a transfer layer is applied above the amorphous carbon layer. In at least one exemplary embodiment, the transfer layer is not used. The amorphous carbon attenuator can be patterned directly by the photoresist. In alternative embodiments, use of a transfer layer can be advantageous to the step of patterning the attenuator. The transfer layer can be applied using a variety of different techniques. In a step 65, a photoresist layer is applied above the transfer layer. The photoresist layer can be patterned in a variety of different ways, such as, lithography. An application of the amorphous carbon layer, the transfer layer, and the photoresist layer is described below with reference to FIG. 3.

In a step 70, the photoresist layer is patterned. One photoresist patterning operation is described below with reference to FIG. 4. In a step 75, the transfer layer is etched according to the patterned photoresist layer. The transfer layer can be etched using a variety of different techniques, such as reactive ion etching or plasma etching. One transfer layer etching operation is described with reference to FIG. 5.

In a step 80, the amorphous carbon layer is patterned. In a step 85, the photoresist layer and transfer layer are removed. In at least one embodiment, the patterning of the amorphous carbon layer (step 80) includes a process that simultaneously removes the patterned photoresist layer. The amorphous carbon layer can be etched using a variety of different techniques, such as an oxygen plasma etch or a reactive ion etch (RIE). Alternatively, the patterned photoresist layer is removed before or after the amorphous carbon layer is etched. Further, the transfer layer can be removed after patterning of the amorphous carbon layer using an operation, such as plasma etching. One amorphous carbon layer etching operation is described below with reference to FIG. 6.

In a step 90, a pattern is transferred to an integrated circuit wafer using the patterned amorphous carbon layer and the substrate as an attenuated phase shift mask. One mask patterning operation is described with reference to FIG. 7.

Figure 3:
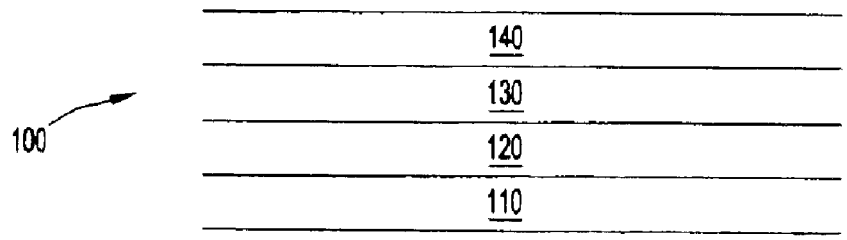
FIG. 3 is a schematic cross-sectional view representation of a portion of a mask, showing a stack application operation in accordance with an exemplary embodiment.

Referring to FIG. 3, a portion 100 of a mask includes a substrate 110, an amorphous carbon layer 120, a transfer layer 130, and a photoresist layer 140. In an exemplary embodiment, substrate 110 can be a glass substrate or a silicon dioxide ($SiO_2$) substrate. In at least one embodiment, no transfer layer is included. Photoresist layer 140 can be photoresist or, alternatively, can be an anti-reflective coating (ARC) layer used in the patterning of underlying layers.

Amorphous carbon layer 120, transfer layer 130, and photoresist layer 140 can be deposited over substrate 110 using a variety of different deposition techniques. For example, chemical vapor deposition (CVD) or physical vapor deposition (PVD) can be used for deposition processes. In alternative embodiments, substrate 110 can be a fluorinate silicon dioxide, fused silica, soda-lime glass, borosilicate glass, or quartz.

By way of example, absorber layer 120 can have a thickness of 100 to 10,000 Angstroms, transfer layer 130 can have a thickness of 100 to 10,000 Angstroms, and photoresist layer 140 can have a thickness of 500 to 10,000 Angstroms. As described below, in an exemplary embodiment, photoresist layer 140 is only needed through the patterning of transfer layer 130. As such, less resist thickness is required and resolution is improved. Photoresists can be positive or negative working. Examples include photoresist product sold by Shipley Company of Marlboro, Mass.

The thicknesses of amorphous carbon layer 120 and transfer layer 130 can be tuned to optimize or minimize the reflectivity. Selecting thicknesses to minimize reflectivity as such can reduce or remove standing waves and improve critical dimension (CD) control.

Figure 4:
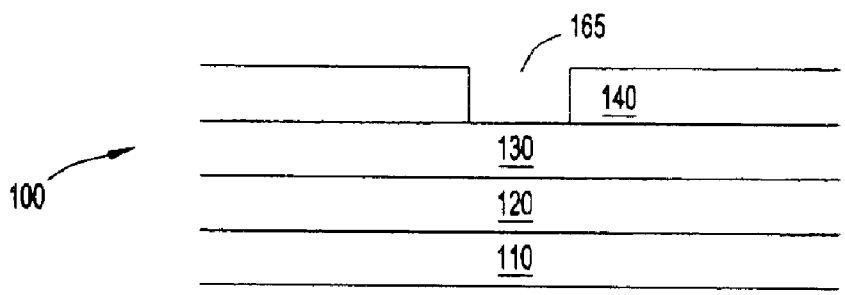
FIG. 4 is a schematic cross-sectional view representation of the portion of the mask of FIG. 3, showing a photoresist patterning operation.

FIG. 4 illustrates portion 100 after a patterning operation. In an exemplary embodiment, photoresist layer 140 is patterned to have apertures 165. This patterning can be performed using any of a variety of patterning techniques or patterning equipment, such as electron beam lithography, laser raster scanning lithography, or projection lithography.

Figure 5:
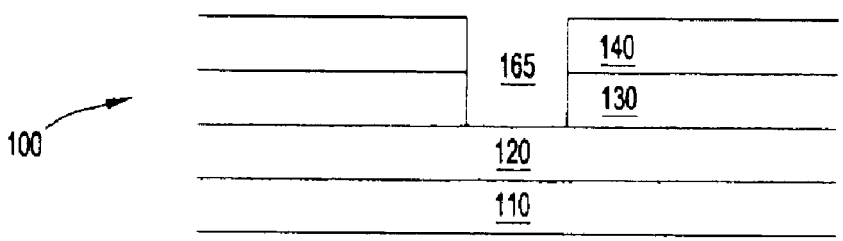
FIG. 5 is a schematic cross-sectional view representation of the portion of the mask of FIG. 3, showing an transfer layer etching operation.

FIG. 5 illustrates portion 100 after an etching operation. Once photoresist layer 140 is patterned, an etching process is provided to etch transfer layer 130. The etching process extends apertures 165 through transfer layer 130.

Figure 6:
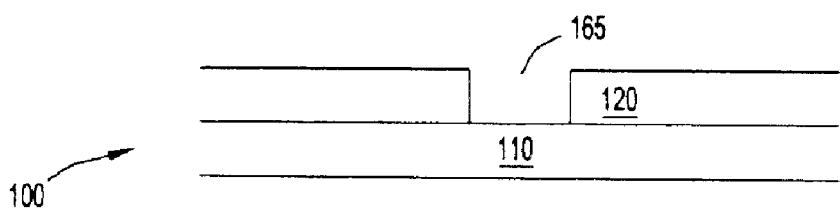
FIG. 6 is a schematic cross-sectional view representation of the portion of the mask of FIG. 3, showing an amorphous carbon etching operation.

FIG. 6 illustrates portion 100 after another etching operation. An etching process is provided to extend apertures 165 through amorphous carbon layer 120. In an exemplary embodiment, during the etching of transfer layer 130, photoresist layer 140 can be removed. Accordingly, in one advantageous step, layer 140 can be simultaneously removed when layer 130 is selectively etched. Alternatively, layer 140 can be separately removed before or after layer 130 is selectively etched.

In another exemplary embodiment, along with the etching of amorphous carbon layer 120, photoresist layer 140 can be removed. Accordingly, in one advantageous step, layer 140 is simultaneously removed as layer 120 is selectively etched. Alternatively, layer 140 can be separately removed before or after layer 120 is selectively etched. The etching process can include an etch using wet etching chemistries, reactive ion etching, or a plasma etch.

Figure 7:
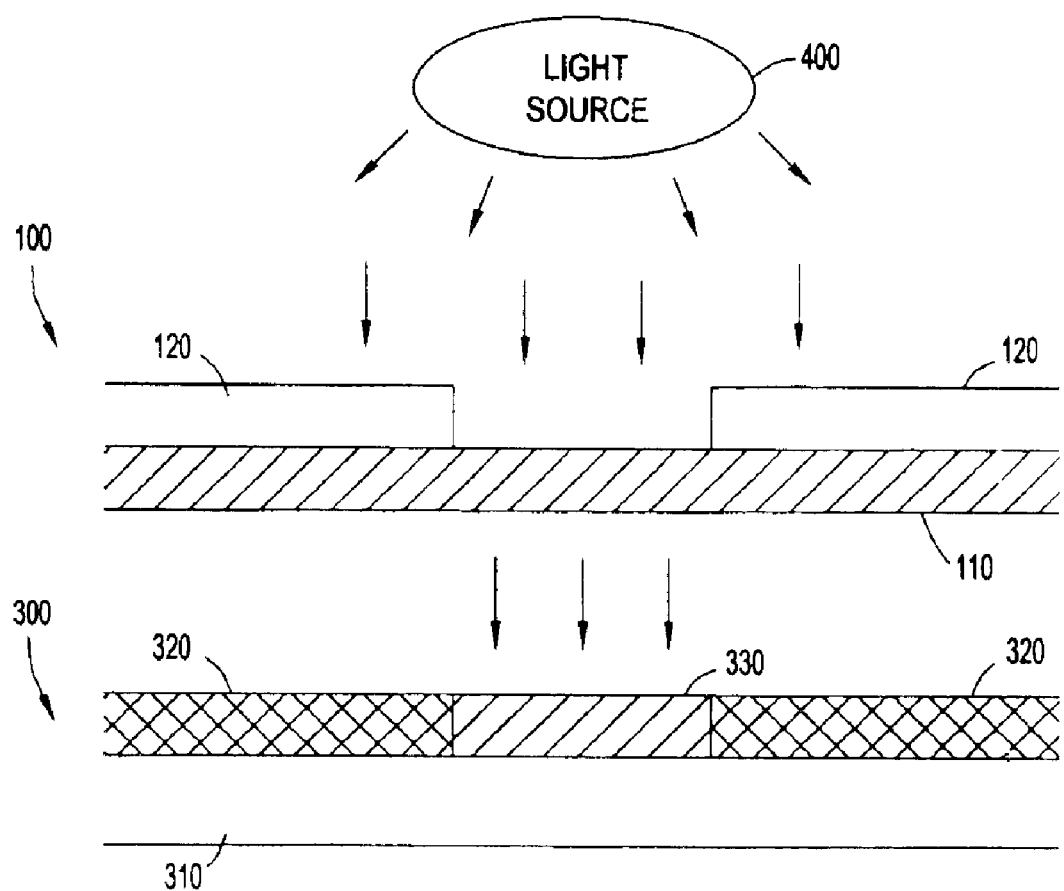
FIG. 7 is a cross-sectional view representation of an attenuated phase shift mask system in accordance with an exemplary embodiment.

FIG. 7 illustrates portion 100 included in an attenuated phase shift mask (PSM) system 200. In an exemplary embodiment, portion 100 is provided between an integrated circuit wafer 300 and a light source 400. Integrated circuit wafer 300 can include a substrate 310 and a photoresist layer 320. Light source 400 can be a excimer laser light source, for example, manufactured by Cymer of San Diego, Calif.

Light source 400 projects light through portion 100. Light passing through aperture 165 and substrate 110 passes without attenuation. Light passing through amorphous carbon layer 120 is attenuated such that the light has a phase delay of 180 degrees. In an exemplary embodiment, amorphous carbon layer 120 causes a 95–50% reduction in intensity of the light. Amorphous carbon layer 120 can be 5–50% transparent.

The phase shift is determined by the thickness and the refractive index of the amorphous carbon. These parameters are adjusted to give a phase shift (or phase delay) of 180 degrees. A 180 degree phase shift layer has a thickness of wavelength divided by the index of refraction divided by 2. Layer 120 can be selected to be an opaque layer as opposed to conventional phase shift masks which utilize trenches in the mask substrate. Portion 100 of the mask relies on an additional layer (layer 120) which is made from a material which can also be used for opaque regions if it is thick enough.

Light projected through portion 100 exposes a photoresist region 330 in photoresist layer 320. Accordingly, integrated circuit wafer 300 can be patterned. Advantageously, the use of an attenuated phase shift mask improves the contrast or acuity of the projected mask pattern.

While the exemplary embodiments illustrated in the FIGURES and described above are presently preferred, it should be understood that these embodiments are offered by way of example only. Other embodiments may include, for example, different materials used as transfer layers to interact with the amorphous carbon layer. The invention is not limited to a particular embodiment, but extends to various modifications, combinations, and permutations that nevertheless fall within the scope and spirit of the appended claims.

What is claimed is:

1. A phase shifting mask comprising:
    a glass substrate layer; and
    an amorphous carbon absorber layer located above the glass substrate layer, the amorphous carbon absorber layer including apertures through which light passes unaltered to the glass substrate layer, wherein light passing through the amorphous carbon absorber layer is attenuated by 15% to 50%.

2. The mask of claim 1, wherein the amorphous carbon absorber layer has a thickness of 500–2,000 Angstroms.

3. The mask of claim 1, wherein the amorphous carbon absorber layer has a thickness selected to provide a 180° phase shift.

4. The mask of claim 1, wherein the amorphous carbon absorber layer has a refractive index that provides a 180° phase shift.

5. The mask of claim 1, wherein the amorphous carbon absorber layer is deposited by plasma enhanced chemical vapor deposition (PECVD).

6. The mask of claim 1, wherein the amorphous carbon absorber layer has an intensity reduction of 95–50%.

7. An attenuated phase shift mask having an amorphous carbon absorber film used in transferring patterns to an integrated circuit wafer, the mask comprising:
    a substrate;
    an amorphous carbon absorber layer above the substrate;
    a transfer layer above the amorphous carbon absorber layer during a patterning process in which the amorphous carbon absorber layer is patterned; and an anti-reflective coating (ARC) layer above the transfer layer during the patterning process.

8. The mask of claim 7, wherein the amorphous carbon absorber layer is patterned using the ARC layer and transfer layer.

9. The mask of claim 7, wherein the amorphous carbon absorber layer has a thickness of 500–2,000 Angstroms.

10. The mask of claim 7, wherein the transfer layer is a chromium layer.

11. The mask of claim 7, wherein the transfer layer has a thickness of 5–200 nm.

12. The mask of claim 7, wherein the ARC layer has a thickness of 100–400 nm.

13. The mask of claim 7, wherein the amorphous carbon absorber layer is provided above the substrate by a plasma enhance chemical vapor deposition (PECVD) from a hydro carbon gas.

14. An attenuated phase shift mask system comprising:

a phase shift mask including a substrate and a patterned amorphous carbon layer above the substrate;

a light source positioned above the phase shift mask and configured to provide light to the phase shift mask; and an integrated circuit wafer located below the phase shift mask, the integrated circuit wafer being configured to receive a pattern from the phase shift mask, wherein light from the light source is attenuated by 50 to 80% when passing through the amorphous carbon layer.

15. The system of claim 14, wherein the patterned amorphous carbon layer has a thickness of 500–2,000 Angstroms.

16. The system of claim 14, wherein the patterned amorphous carbon layer includes apertures where light from the light source is unaltered and attenuation portions where the light is attenuated.

17. The system of claim 16, wherein the light source transmits light through the apertures in the patterned amorphous carbon layer and patterns a photoresist region in the integrated circuit wafer.

18. The system of claim 14, wherein the patterned amorphous carbon layer is deposited using a plasma enhanced chemical vapor deposition process.

* * * * *